United States Patent
Luiten et al.

(10) Patent No.: US 9,572,282 B2
(45) Date of Patent: Feb. 14, 2017

(54) HEAT CONDUCTOR DEVICE AND METHOD OF FORMING A HEAT CONDUCTOR DEVICE

(71) Applicant: TP VISION HOLDING B.V.

(72) Inventors: Gwendolyn Anita Luiten, Riethoven (NL); Luc Henri Jozef Peeters, Borsbeek (BE)

(73) Assignee: TP VISION HOLDING B.V., Eindhoven (NL)

( * ) Notice: Subject to any disclaimer, the term of this patent is extended or adjusted under 35 U.S.C. 154(b) by 25 days.

(21) Appl. No.: 14/437,921

(22) PCT Filed: Oct. 15, 2013

(86) PCT No.: PCT/EP2013/071541
§ 371 (c)(1),
(2) Date: Apr. 23, 2015

(87) PCT Pub. No.: WO2014/067775
PCT Pub. Date: May 8, 2014

(65) Prior Publication Data
US 2015/0296655 A1    Oct. 15, 2015

(30) Foreign Application Priority Data
Oct. 29, 2012    (EP) .................................... 12190391

(51) Int. Cl.
*H05K 7/20*    (2006.01)
*H01L 23/373*    (2006.01)
(Continued)

(52) U.S. Cl.
CPC ........... *H05K 7/2039* (2013.01); *H01L 23/367* (2013.01); *H01L 23/373* (2013.01);
(Continued)

(58) Field of Classification Search
CPC ........ H05K 7/20; H01L 23/367; H01L 23/373
(Continued)

(56) References Cited

U.S. PATENT DOCUMENTS 6,075,700 A * 6/2000 Houghton ........... H01L 23/3675
165/80.2
6,424,531 B1 * 7/2002 Bhatti ....................... F28F 3/02
165/185
(Continued)

OTHER PUBLICATIONS

STIC search report.*
(Continued)

*Primary Examiner* — Dion R Ferguson
*Assistant Examiner* — Mandeep S Buttar
(74) *Attorney, Agent, or Firm* — Michael Best & Friedrich LLP

(57) ABSTRACT

The invention provides a heat conductor device (10) for removing heat from an electrical component (12) operating in a frequency range, the device comprising a body (13) having a first thermal conductivity, characterized in that the body (13) is provided with a heat spreader (14) comprising a pattern of thermally conducting tiles (20, 50, 51, 52, 61) separated by gaps (21), the tiles having a second thermal conductivity higher than the first thermal conductivity, wherein each tile has at most a maximum area value and the gaps have at least a minimum gap width, and the maximum area and the minimum width are dimensioned for conforming to a predetermined electromagnetic interference characteristic of the heat conductor device when combined with the electrical component operating in the frequency range. The invention also provides a method for forming a heat conductor device.

14 Claims, 7 Drawing Sheets

(51) Int. Cl.
  *H01L 23/66* (2006.01)
  *H01L 23/367* (2006.01)
(52) U.S. Cl.
  CPC ...... *H01L 23/3731* (2013.01); *H01L 23/3735* (2013.01); *H01L 23/3736* (2013.01); *H01L 23/3737* (2013.01); *H01L 23/66* (2013.01); *H01L 2924/0002* (2013.01)
(58) Field of Classification Search
  USPC .......................... 361/704; 428/323; 524/495
  See application file for complete search history.

(56) References Cited

U.S. PATENT DOCUMENTS

| | | | |
|---|---|---|---|
| 2005/0189647 A1* | 9/2005 | Sung | H01L 23/373 257/720 |
| 2006/0047053 A1 | 3/2006 | Pawlenko et al. | |
| 2012/0026692 A1 | 2/2012 | Loong et al. | |

OTHER PUBLICATIONS

STIC Search Report (Jul. 8, 2016).*
International Search Report in PCT/EP2013/071541 dated Nov. 13, 2013.

* cited by examiner

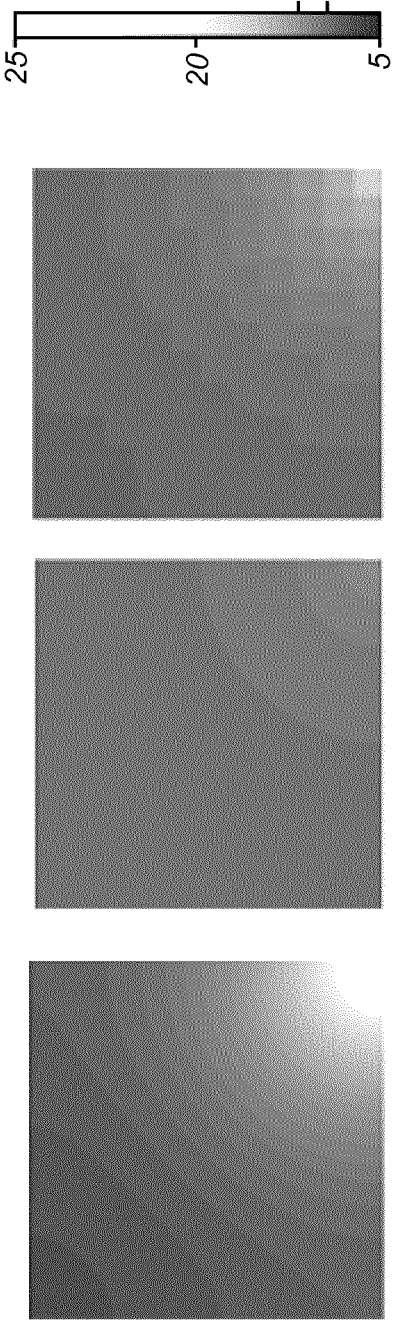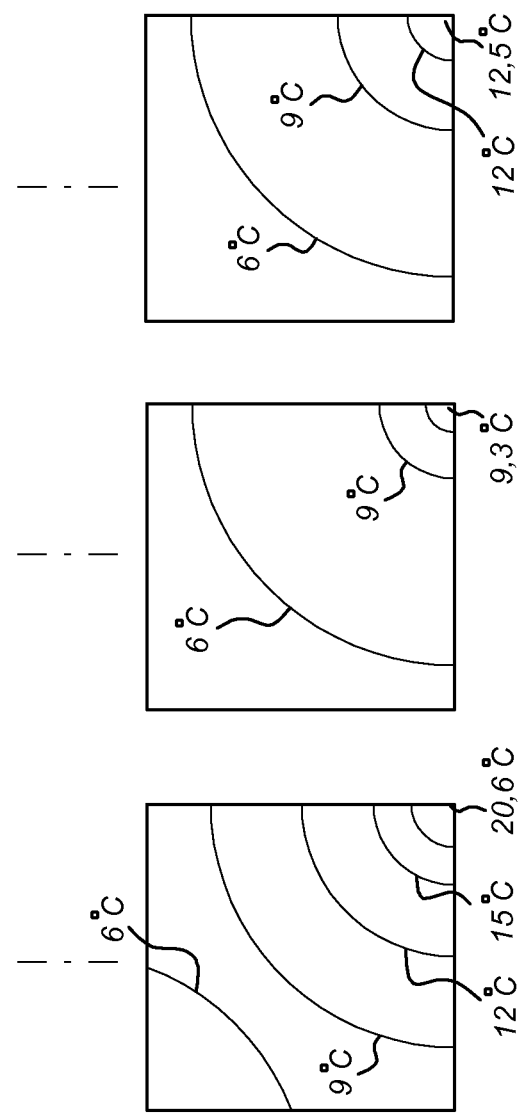
Fig. 3a  Fig. 3b  Fig. 3c

Fig. 4a        Fig. 4b
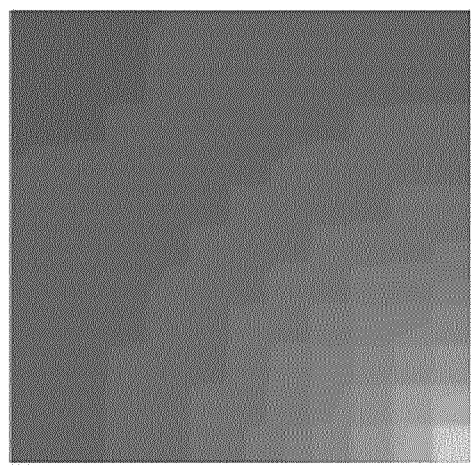 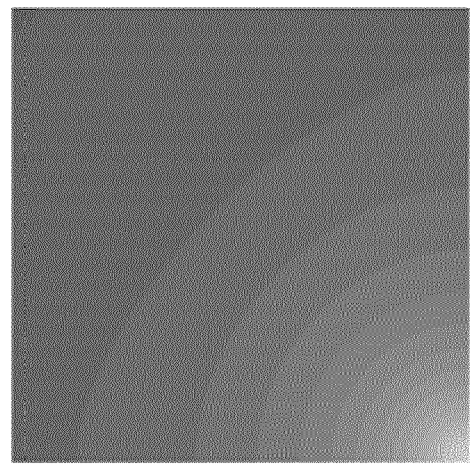 
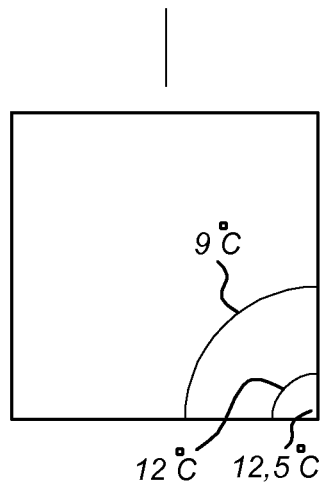 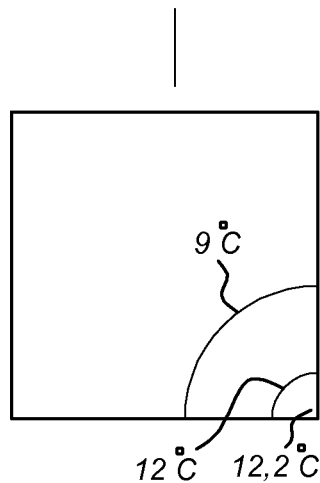

HEAT CONDUCTOR DEVICE AND METHOD OF FORMING A HEAT CONDUCTOR DEVICE

FIELD OF THE INVENTION

The invention relates to a heat conductor device for removing heat from an electrical component, particularly an electrical component that functions at a high frequency, for example in the GigaHertz (GHz) domain. The invention also relates to a method of forming a heat conductor device.

BACKGROUND OF THE INVENTION

An electrical component that needs cooling is placed in thermal contact with a thermally conductive material, also called a heat conductor device or heat sink. However, materials with good thermal conductivity (such as metal) also tend to have good electrical conductivity.

A nearby layer with good electrical conductivity is problematic when used in conjunction with high frequency devices such as for processor integrated circuits (ICs) or memory ICs operating in the Megahertz (MHz) or Gigahertz (GHz) domain. In these applications, the conducting surface of the surrounding layer acts as a radiator for source currents which are present internally in the IC. The surface can also act as a reflector of electromagnetic (EM) waves. This behaviour can interfere with the functioning of other electrical components and is, for that reason, often forbidden by regulations.

It is known to use other, non-conducting or poorly electrically conducting materials, such as ceramics. However, ceramics are relatively expensive and have, compared to electrical conductors, a generally poor thermal conductivity.

Another material that is used are polymers or plastics. Plastics are less expensive than ceramics, but have even poorer heat conducting properties.

It is noted that US 2006/047 053 discloses an electrically conductive polymer composition which also has a degree of thermal conductivity. A plurality of discrete electrically conductive elements are incorporated into the polymer composition. These elements give the polymer composition a degree of electrical conductivity that is intended to shield an IC coated with the polymer from electromagnetic interference (EMI) and/or radio frequency (RF) radiation. The IC is to be surrounded by the electrically conductive polymer composition or by a combination of the electrically conductive polymer composition and another electrical conductor so that a closed Faraday cage is formed. Heat conductor devices, or heat sinks, to which the present invention relates, typically are intended to enlarge the area of heat transfer and therefore typically cover only part of the IC and do not surround the IC. Heat sinks for high frequency components must be carefully designed to prevent acting as an antenna, which is not a concern of the shielding application of US 2006/047 053, which material is therefore generally unsuitable for use in heat sinks.

There is thus a need for a heat conductor device with good thermal conductivity for removing heat from electrical components which does not simultaneously act as a radiator or reflector in the frequency domain of the component.

SUMMARY OF THE INVENTION

The invention provides a heat conductor device for removing heat from an electrical component operating in a frequency range, the device comprising a body having a first thermal conductivity, wherein the body is provided with a heat spreader comprising a pattern of thermally conducting tiles having a second thermal conductivity higher than the first thermal conductivity, wherein the tiles each have an area and are separated by gaps.

The tile area and gaps are determined in dependence of the frequency range of the electrical component for conforming to a predetermined electromagnetic interference (EMI) characteristic of the heat conductor device. The material of the first body typically has a very low electrical conductivity, in order to conform to the EMI characteristic.

Each tile has an area that is small enough to prevent an individual tile from absorbing electromagnetic energy originating from the high-frequency currents inside the electrical component. At the same time, each tile has an area that is as large as possible in order to improve the heat conducting properties of the heat spreader layer and thus of the heat conductor device. Each gap forms a distance between adjacent tiles that is large enough to function as a barrier against electrical currents in the frequency range of the electrical component. At the same time, each gap is as small as possible to improve the heat conducting properties of the heat spreader layer and thus of the heat conductor device. As a result, the patterned heat spreader maximally increases the effective thermal conductivity of the heat conductor device, while minimally increasing the effective electrical conductivity of the heat conductor device.

In other words, the invention provides a patterned heat spreading layer, comprising "islands" of a high (electrical and thermal) conductivity heat spreader material instead of a full layer. The gaps between the conducting islands are a barrier to electrical currents, but if these are made sufficiently narrow, they are still able to pass heat between tiles. Furthermore, if the island size is well below the EM wavelength, the conducting islands will not function as an antenna, and the small size will also limit the size of a possible current loop, thereby limiting radiation as well.

Another way of describing a solution according the invention is as follows. The invention provides a heat conductor device for removing heat from an electrical component operating in a frequency range, the device comprising a body having a first thermal conductivity. The combination of heat conductor device and electrical component conform to a predetermined requirement for maximal electromagnetic interference. The invention is characterized in that the body is provided with a heat spreader comprising a pattern of thermally conducting tiles having a second thermal conductivity higher than the first thermal conductivity. The tiles are separated by gaps and the pattern designed in such a manner that the effective thermal conductivity of the patterned body is higher, preferably at least 50% or 100% higher, than the first thermal conductivity while the combination of heat conductor device and electrical component still conforms to the predetermined requirement for maximal electromagnetic interference.

The apparent enhanced thermal conductivity caused by the patterned heat spreader advantageously allows using larger cooling surfaces, e.g. larger heat sink bases, and consequently allows higher device power dissipation.

Furthermore enhancing thermal conductivity of non-electrically conducting (thermal) plastics enables use of plastic heat sinks in sizes that are currently only possible in ceramic. Replacing ceramic by plastic entails a large saving in costs and weight and allows for greater design flexibility e.g. in the integration of mounting devices.

In general, the invention allows improved heat sink properties of non-conductive materials (e.g. plastics) by adding a highly conductive (graphite or other) pattern, for example at the base of the heat sink. The invention simultaneously allows acceptable electromagnetic compatibility (EMC) characteristics of the heat sink by avoiding large electrically conductive areas within a certain frequency range (depending on product family other legal boundaries will apply). By adjusting the size and spacing of the conducting pattern element, the skilled person can meet the required practical or legal EMC behaviour.

An exemplary heat spreader material (i.e. the material of the islands of the pattern) is graftech SS500 graphite heat spreader material. Another exemplary material is aluminium. Other metals can also be used as material for the tiles.

Another advantage of patterns over uniform layers provided on top of a thermally conducting body, is that the pattern is not subjected to stresses due to a difference in the thermal expansion coefficients of the body and the layer.

In an embodiment according the invention, each tile has an area with a main dimension that is at most 10%, preferably at most 5%, more preferably at most 1% of a characteristic wavelength of the operating frequency range of the electrical component. This ensures that the area of the tile is well below an area in which significant current loops may occur in the tile.

In an embodiment according the invention, the size of each gap is at least 0.1%, preferably at least 0.5%, more preferably at least 1% of a characteristic wavelength of the operating frequency range of the electrical component. This advantageously ensures that the effective electrical conductivity of the pattern remains low, even though the tiles themselves may be electrically conducting.

In an embodiment according the invention, the pattern is a regular grid. A regular grid has advantages in manufacturing and can be more easily modelled so that performance calculations can be made.

In an embodiment according the invention, a main dimension of a tile is between 0.5 mm and 5 mm, preferably between 1 mm and 4 mm, more preferably between 1.5 mm and 2.5 mm and a gap is between 0.1 mm and 1.2 mm, preferably between 0.15 mm and 5 mm, more preferably between 0.15 mm and 0.25 mm. Ty These dimensions have been shown to give good results.

In an embodiment according the invention, the first heat conductivity is at least 1 W/mK. In an embodiment, the first heat conductivity is at most 50 W/mK, more preferably at most 25 W/mK. In an embodiment, the second heat conductivity is at least 50 W/mK, or at least 100 W/mK, or at least 250 W/mK, or at least 500 W/mK.

In an embodiment according the invention, the tiles or islands are made of graphite.

In an embodiment according the invention, the body comprises a polymer or ceramic.

The invention further provides a film for adhering to a body of a heat conductor device, the film comprising a pattern of thermally conducting tiles according to any of the previous claims.

The invention also provides an assembly of a heat conductor device according the invention and an electrical component. The electrical component can be a video processor IC, an SDRAM module, or any other component. The invention can be advantageously applied if the electrical component operates at an operating frequency, for example a frequency higher than 500 MHz, higher than 1 GHz, or higher than 1.5 GHz. In an embodiment, the IC operates at 1600 MHz.

Still further, the invention provides a method of forming a patterned heat conductor device, the method comprising providing a heat conductor device having a body having a first thermal conductivity, characterized by providing said body with a pattern of thermally conducting tiles having a second thermal conductivity higher than the first thermal conductivity, wherein the tiles each have an area and are separated by gaps, and wherein the tile area and gaps are determined in dependence of the frequency range of the electrical component for conforming to a predetermined electromagnetic interference characteristic of the heat conductor.

In an embodiment according the invention, the pattern is provided through laser etching of a surface of the body. In this manner, a heat spreader pattern can effectively be formed on an outside surface of an heat spreader device body.

In an embodiment according the invention, the pattern is provided through injection moulding the body around a substrate on which the pattern is formed. In this manner, the pattern can be efficiently formed inside a heat spreader device body.

BRIEF DESCRIPTION OF THE FIGURES

Examples of embodiments according the invention will now be described in reference to the attached figures, in which, FIGS. 1a and 1b schematically shows a heat conductor device according to an embodiment of the invention;

FIGS. 3a-3c schematically show the results of model calculations;

FIGS. 4a and 4b schematically show additional model calculations;

DETAILED DESCRIPTION

Figure 1A:
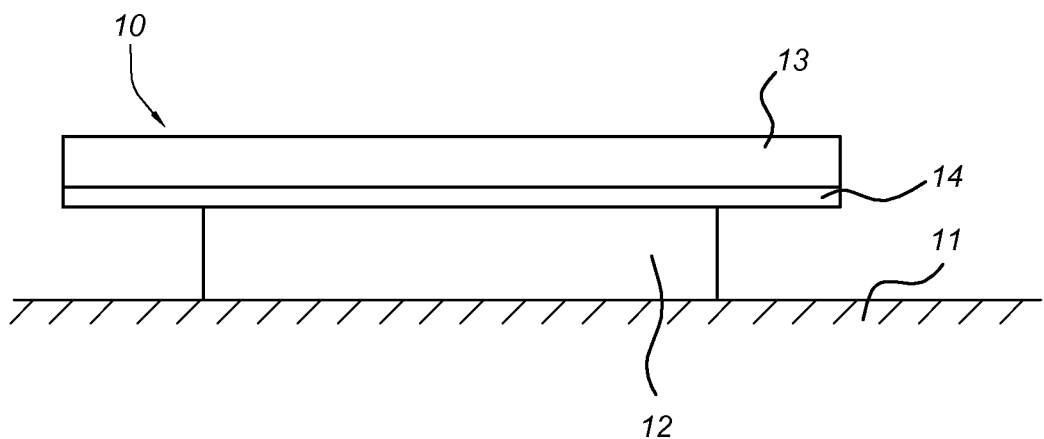

FIG. 1a schematically shows a heat conductor device 10 provided in thermal contact with an electrical component 12, in the present example an integrated circuit (IC) 12. The heat conductor device 10 comprises a body 13 made of plastic. Plastic advantageously has an essentially zero electrical conductivity, and thus does not give rise to the problems of radiating electromagnetic radiation if the plastic is provided on top of a high-frequency IC. Instead of plastic, any other material having a sufficiently low electrical conductivity can be used. A typical thickness of the body is between 0.5 and 5 mm, for example 1.5 mm. The body 13 is provided with a heat spreader 14 which will now be discussed in more detail in reference to FIGS. 2a and 2b. In the example of FIG. 1a, the heat spreader is located between the IC 12 and the body 13. In an alternative configuration, the heat spreader may be provided on top of the body 13, not facing the IC 12.

Figure 1B:
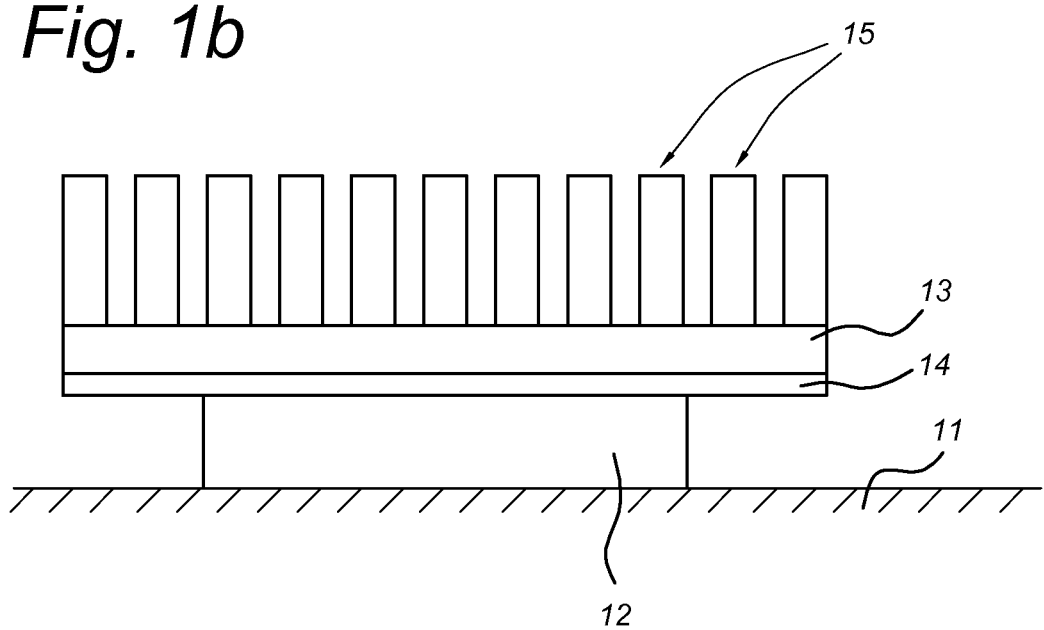

FIG. 1b shows a further alternative arrangement, in which the body 13 is provided with cooling fins 15. The fins are attached to the side of the body 13 not facing the IC, and the heat spreader 14 is located between the body 13 and the IC 12. The patterned heat spreader 14, facing the IC, efficiently helps to spread heat from the IC through the body 13 of the thermal conductor. The heat absorbed by the body 13 can be given to the surrounding environment through the heat fins 15 provided on the body 13.

In the examples of FIGS. 1a and 1b, the surfaces of the body 13 and the heat spreader 14 facing the IC have a significantly larger area than the top surface of the IC. Consequently, the edges of the body and heat spreader extend beyond the edges of the IC. This is the most common configuration for a heat sink. However, the invention may also be practiced using a heat conductor device 10 according the invention that has the same area as the top of the IC, or even a smaller area.

Figure 2A:
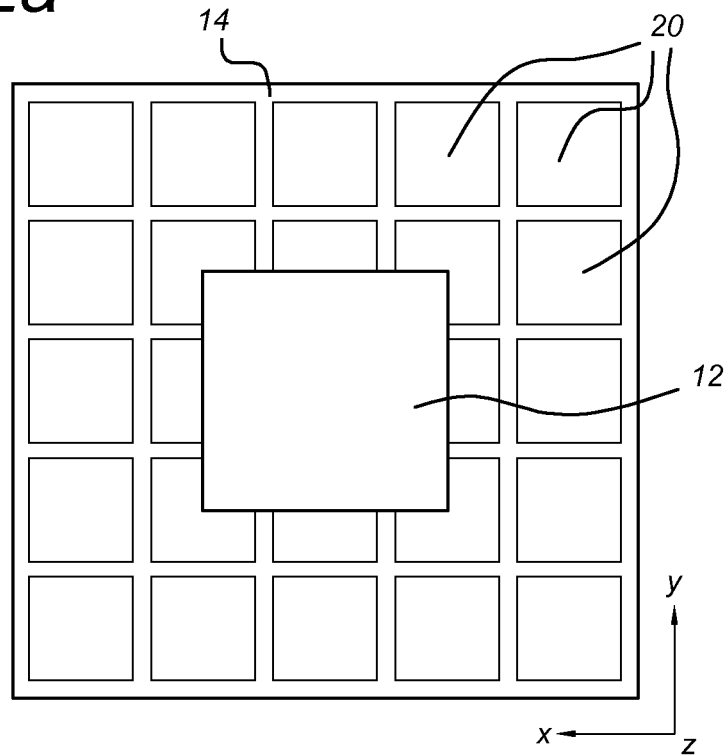
FIG. 2a schematically shows a heat conductor device with heat spreader according to an embodiment of the invention.

FIG. 2a schematically shows a bottom view of the heat conductor device 10 mounted on top of the IC 12 of FIG. 1a with heat spreader 14 in the form of a regular pattern of tiles 20. The tiles are made of a thermally (and thus also electrically) conductive material and have dimensions a and b (see FIG. 2b) and are arranged in a regular grid separated from each other by gap g. In the present example, each tile is an 2 mm by 2 mm, 0.25 mm thick square of electrically conducting graphite. The largest dimension in a particular direction (i.e. size a or b) is also termed the main or characterizing dimension of the tile. In the present example, the gaps are 0.2 mm wide. A suitable heat spreader material is graftech SS500 graphite heat spreader material, but also other suitable graphite and non-graphite materials are available to the skilled person.

The size of the heat spreading islands (pattern tiles) is chosen as large as possible from a thermal point of view, but well below the relevant wavelength of the oscillating currents of the IC to eliminate picking up EMI and to limit the size of eventual current loops. The size of the gaps between the islands is as small as possible to enhance the apparent thermal conductivity, but sufficiently large to retain electrical insulation.

If the IC 12 functions at 1.6 GHz (e.g. SDRAM memory), the corresponding wavelength of the radiation originating from the IC is approximately 188 mm. A pattern of 2 mm by 2 mm squares has a feature size of about 1% of the wavelength, and each individual square would therefore have a very limited contribution to EMI. After all, the squares are so small compared to the wavelength that inside a single square virtually no current loop can be induced by the high frequency currents in the IC.

Figure 2B:
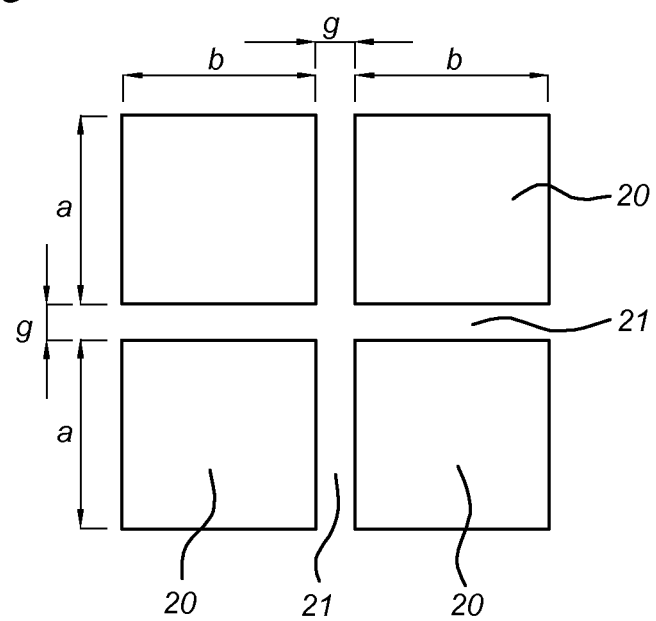
FIG. 2b schematically shows a detail of the heat spreader according to an embodiment of the invention.

FIG. 2b schematically shows a detail of the heat spreader. In this example, the tiles are arranged in a regular pattern or grid. Each tile has a first dimension a and a second dimension b. The third dimension (height or thickness) is not shown in this top view. As indicated above, an exemplary suitable thickness is 0.25 mm for e.g. graphite material. In the present example, a=b and the tiles thus have a square form. In reference to FIGS. 5a-5c, a few other exemplary patterns will be described.

FIGS. 3a-3c schematically show the results of model calculations. In each of the figures, the bottom right corner is in thermal contact with a source of heat to be removed. The sides are adiabatic, and temperatures are calculated relative to an ambient at 0 degrees centigrade. As such, the results can be thought of as modelling a quarter of a heat conductor device 10, the bottom right corner representing the relatively small central area that is in contact with an IC. FIG. 3a shows a model calculation wherein the heat spreader device 10 body 13 is a plastic with heat conductivity k equal to 8 W/mK, and no heat spreader pattern is provided. In the bottom right corner, the temperature exceeds 20 degrees Centigrade. Along a diagonal of the device, the temperature is approximately 9 degrees centigrade. This is an example of relative poor thermal conductivity.

FIG. 3b corresponds to a calculation in which the plastic body 13 of FIG. 2a is provided with a full (i.e. non-patterned) heat spreader layer. This heat spreader layer has an unacceptable EMI characteristic, and is thus only used for comparison. According to the model, the bottom right corner is now at 9.3 degrees Centigrade and along the main diagonal the temperature is approximately 6 degrees Centigrade.

FIG. 3c schematically shows the results for a calculation with a patterned heat spreader. The modelled quarter heat spreader has ten by ten tiles measuring 2 mm by 2 mm with 0.2 mm gaps. In the actual calculations the isotherm lines show ripples that roughly follow the edges of the tiles, as the conducting tiles tend to have a single temperature. In the sketched isotherms of FIG. 3c, this ripple effect is smoothed away. Compared to the calculation of FIG. 3b, the temperature in the bottom right corner is now slightly elevated to 12.5 degrees Centigrade, but still well below the 20.6 degrees Centigrade of the unpatterned thermal plastic body of FIG. 3a. The temperature at the diagonal is, in FIG. 3b, approximately 6 degrees Centigrade. According to the model calculation, the body 13 with patterned heat spreader 14 of FIG. 3c has an effective thermal conductivity of 25 W/mK as compared to the 8 W/mK of only the thermal plastic body 13. Therefore, the patterned heat spreader increases the effective thermal conductivity more than three-fold, while keeping EMI characteristics of the heat conductor device acceptable.

This increase in the effective heat conductivity is also apparent from FIGS. 4a and 4b. FIG. 4a shows the modelled thermal distribution as described in reference to FIG. 3c, e.g. using a 1.5 mm thick body with k=8 W/mK and a patterned heat spreader with graphite tiles with thickness 0.25 mm and k=500 W/mK. Again, in the sketch provided below the calculated results, the calculated ripple effect is smoothed away in the sketched isotherm contours. FIG. 4b shows the thermal distribution of a hypothetical body having k=25 W/mK. Since in FIG. 4b no patterned heat spreader is used, the ripple effect is absent in the calculation. From the facts that the temperature contours (ignoring the ripple) are effectively the same, the conclusion is drawn that the patterned heat spreader of FIG. 4a, comprising a base with k=8 W/mK and tiles with k=500 W/mK, has an effective thermal conductivity of 25 W/mK.

Table 1 presents exemplary data for a core IC in a TV application. This data is also representative for a laptop motherboard: The sensitive frequency range is 30 MHz-2 GHz. In the future, technological and legal developments may move the upper limit of the sensitive frequency range to higher frequencies, e.g. to 6 GHz. The skilled person will be able to apply the invention to any frequency range based on the disclosure in this application.

For the 30 MHz-2 GHz range, the calculations indicate that it is best to avoid floating electrically conductive surfaces with a characteristic or main dimension larger than 5 mm because of undesired radiation and reflection. The equivalent electrical resistance should exceed a threshold value, e.g. 100Ω DC, which results in a requirement for the spacing of at least 0.8 mm. Thermally, the equivalent conductivity of the pattern can be calculated (or simulated). A number of results are shown in table 1 (for a 1.6 mm gap), table 2 (for a 0.8 mm gap) and table 3 (for a 0.4 mm gap). The parameter 't' represents the base thickness and "dotsize" stands for the size (in mm) of the tiles. The parameter h is the heat transfer coefficient, with h=10 W/m²K a value typical for fanless cooling and h=20 W/m²K typical for fan cooled consumer electronics products

TABLE 1

Equivalent thermal conductivity example calculations for 1.6 mm gap

| | | | 1.6 mm gap | | | | |
|---|---|---|---|---|---|---|---|
| k base (W/mK) | | | 1 | 5 | 8 | 12 | 25 |
| | dotsize | run | | | equivalent k | | |
| t = 1 mm | 2 × 2 | h = 10 | 1.9 | 9.1 | 14.4 | 21.0 | 39.1 |
| | | h = 20 | 2.0 | 9.0 | 14.2 | 20.9 | 40.8 |
| t = 2 mm | 2 × 2 | h = 10 | | | 7.3 | 11.5 | 16.6 |
| | | h = 20 | 1.5 | 7.3 | 11.5 | 17.1 | 32.9 |
| | 4 × 4 | h = 10 | | | 12.9 | 18.5 | 24.5 |
| | | h = 20 | | | 13.4 | 19.6 | 26.7 |
| | 8 × 8 | h = 10 | | | 23.2 | 29.3 | 34.7 |
| | | h = 20 | | | 25.7 | 33.3 | 40.6 |

TABLE 2

Equivalent thermal conductivity example calculations for 0.8 mm gap

| | | | 0.8 mm gap | | | | |
|---|---|---|---|---|---|---|---|
| k base (W/mK) | | | 1 | 5 | 8 | 12 | 25 |
| | dotsize | run | | | equivalent k | | |
| t = 1 mm | 2 × 2 | h = 10 | 2.4 | 11.7 | 18.2 | 26.0 | 46.0 |
| | | h = 20 | 2.5 | 11.5 | 18.0 | 26.1 | 48.9 |
| t = 2 mm | 2 × 2 | h = 10 | | | 8.5 | 13.2 | 18.7 |
| | | h = 20 | 1.7 | 8.4 | 13.3 | 19.5 | 36.4 |
| | 4 × 4 | h = 10 | | | 15.5 | 21.6 | 27.7 |
| | | h = 20 | | | 16.1 | 23.2 | 30.9 |
| | 8 × 8 | h = 10 | | | 26.7 | 32.5 | 37.5 |
| | | h = 20 | | | 29.9 | 37.6 | 44.7 |

TABLE 3

Equivalent thermal conductivity example calculations for 0.4 mm gap

| | | | 0.4 mm gap | | | | |
|---|---|---|---|---|---|---|---|
| k base (W/mK) | | | 1 | 5 | 8 | 12 | 25 |
| | dotsize | run | | | equivalent k | | |
| t = 1 mm | 2 × 2 | h = 10 | 3.3 | 15.6 | 23.8 | 33.0 | 54.4 |
| | | h = 20 | 3.3 | 15.4 | 23.7 | 33.7 | 59.6 |
| t = 2 mm | 2 × 2 | h = 10 | | | 10.4 | 15.7 | 21.7 |
| | | h = 20 | 2.1 | 10.3 | 16.1 | 23.0 | 41.0 |
| | 4 × 4 | h = 10 | | | 18.8 | 25.2 | 31.3 |
| | | h = 20 | | | 19.8 | 27.6 | 35.6 |
| | 8 × 8 | h = 10 | | | 30.1 | 35.5 | 39.9 |
| | | h = 20 | | | 34.3 | 41.7 | 48.3 |

A example workable range is: a graphite grid sized 3.5 mm by 3.5 mm with spacing (gap) 0.9 mm to a 4.5 mm by 4.5 mm grid with spacing larger than 1.1 mm. The concept is particularly applicable to any kind of IC or electrical device where heat sink cooling is required and EMC boundaries exclude classical metal heat sinks.

In a further example, applicant has found by practical testing that a graphite grid sized 4 mm by 4 mm with spacing larger than 1 mm is sufficient in order to (1) obtain the minimal required thermal conductivity to act as a heat sink; (2) obtain an electrically conductive area, small enough not to act as an antenna in a frequency range up to 2 GHz, nor by direct contact (patch antenna effect), nor by reflection of EM waves.

In general, it is noted that the exact dimensions also depend on: required thermal conductivity and frequency of the potential EM radiation. Based on the disclosure in this application and the examples provided a skilled person can design a pattern according the invention so that the patterned heat conductor device meets the heat conducting and EMI requirements of any particular configuration.

Figure 5A:
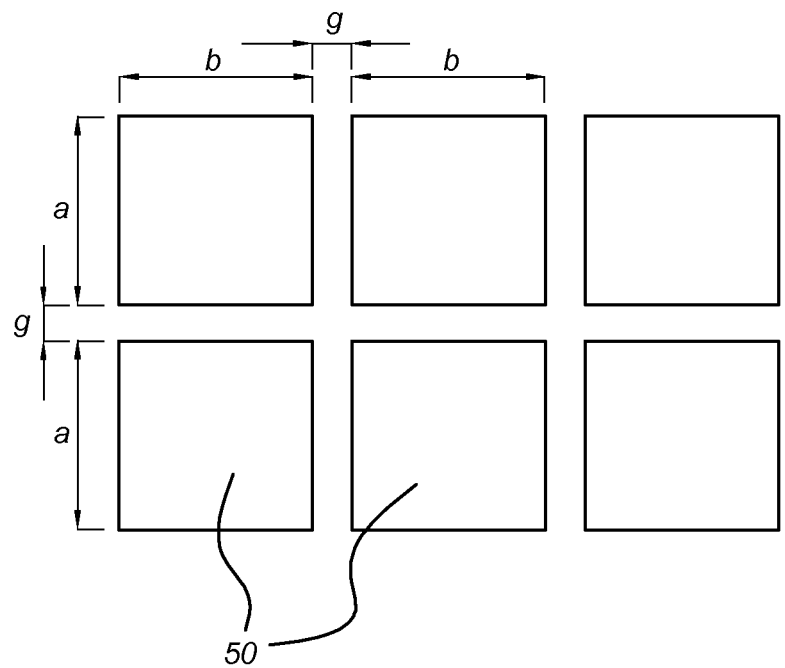
FIGS. 5a-5c schematically show heat spreader patterns.
Figure 5B:
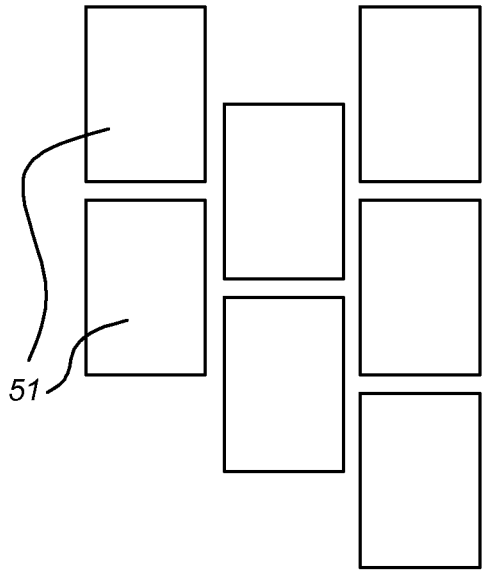
Figure 5C:
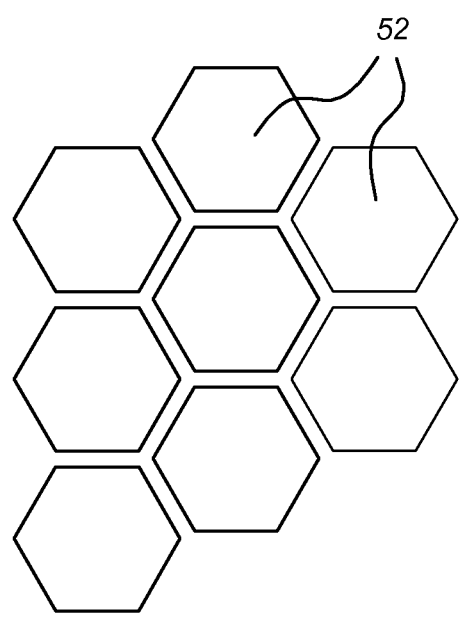

FIGS. 5a-5c schematically show a number of possible heat spreader patterns. FIG. 5a shows a square tile 50 with dimensions a and b, in a grid-like fashion separated by gaps g. In FIG. 5b, the tiles 51 are rectangular, and arranged in a bricklike fashion, separated by gaps. FIG. 5c shows a hexagon or honeycomb pattern, with hexagonal tiles 52.

Figure 6:
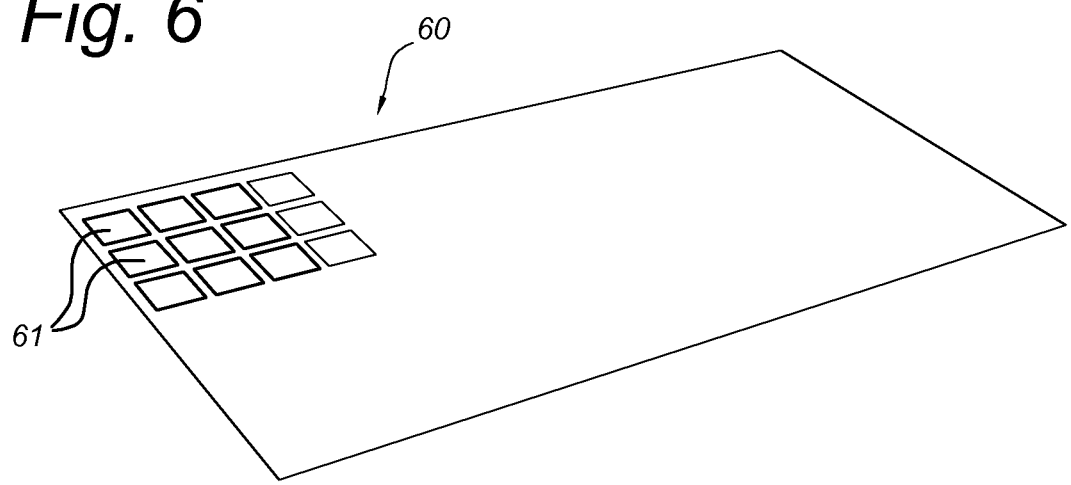
FIG. 6 schematically shows an heat spreader on an adhesive film.

FIG. 6 schematically shows an heat spreader on an adhesive film. The film comprises a heat spreader pattern in the form of tiles, according to any of the heat spreader embodiments according the invention. The film can be adhered to a body 13 of a heat spreader device, thereby providing the increase in effective thermal conductivity as explained above without adversely affecting the EMI characteristic. Such a film advantageously allows existing heat spreader devices to be upgraded. The film can be applied to plastic bodies or ceramic bodies, or to any other type of material used for heat spreaders.

The film can be a kapton film with a copper heat spreader pattern etched or laser engraved upon it, that is to be stuck on a plastic heat sink base.

Figure 7:
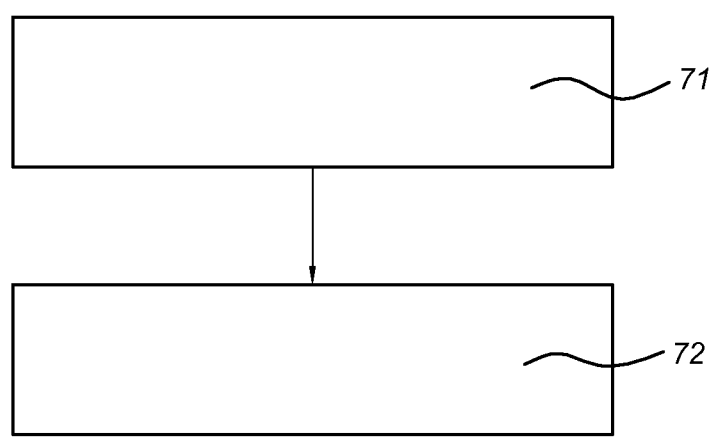
FIG. 7 schematically shows a method for forming a heat conductor device according to an embodiment of the invention.

FIG. 7 schematically shows a method of forming a patterned heat conductor device. The method comprises providing 71 a heat conductor device having a body having a first thermal conductivity. In action 72, said body is provided with a pattern of thermally conducting tiles having a second thermal conductivity higher than the first thermal conductivity. The tiles each have an area and are separated by gaps, and the tile area and gaps are determined in dependence of the frequency range of the electrical component for conforming to a predetermined electromagnetic interference characteristic of the heat conductor.

In an exemplary embodiment, action 72 comprises providing the pattern through laser etching of a surface of the body. In this manner, a heat spreader pattern can effectively be formed on an outside surface of an heat spreader device body.

In a further exemplary embodiment, action 72 comprises providing the pattern through injection moulding the body around a substrate on which the pattern is formed. In this manner, the pattern can be efficiently formed inside a heat spreader device body.

In a further exemplary embodiment, action 72 comprises providing the pattern by providing the body with the adhesive film of FIG. 6.

Figure 8A:
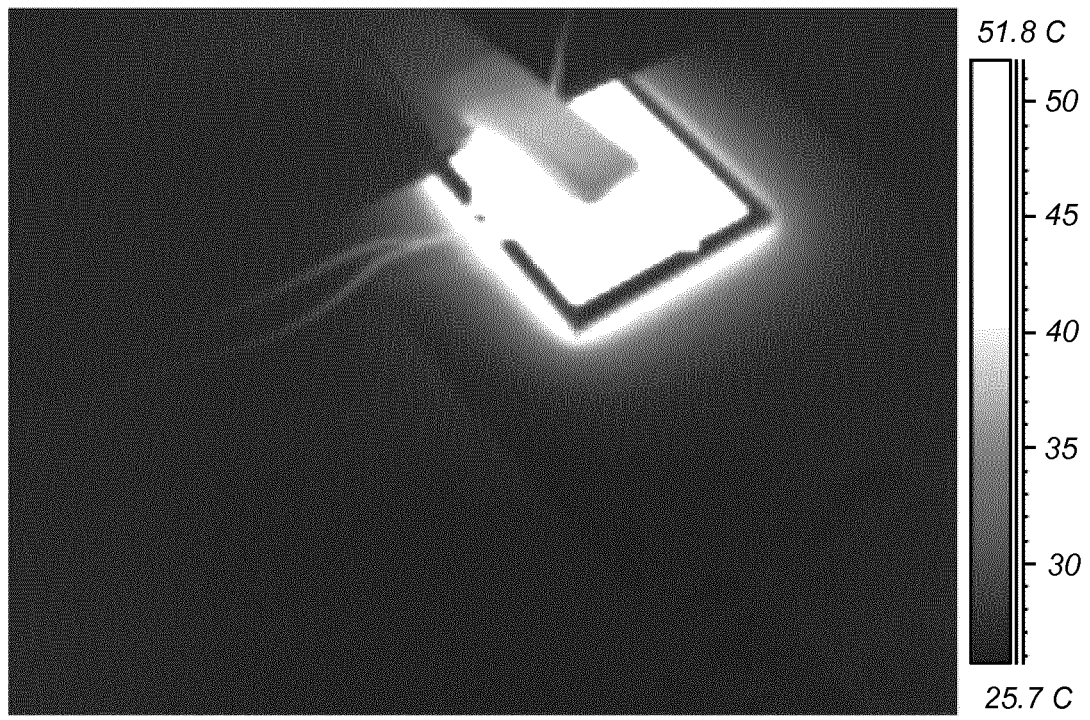
FIGS. 8a and 8b show results of experiments with a conventional heat conductor device and a heat conductor device according to an embodiment of the invention.
Figure 8B:
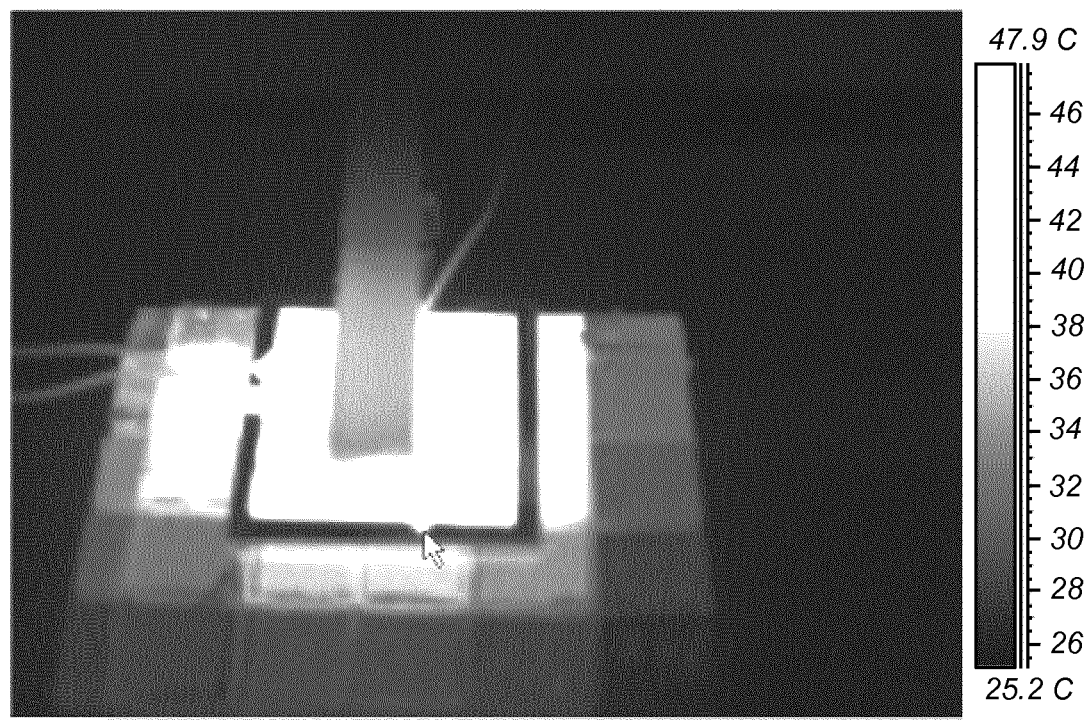

FIGS. 8a and 8b show an experiment comparing the operation of a conventional plastic heat conductor device (FIG. 8a) with a heat conductor device according to an embodiment of the invention (FIG. 8b). The figures are thermal (infrared) photographs, with dark areas indicating relatively low temperatures and bright areas indicating relatively high temperatures. In both images, the heat conductor device is provided with a heated square. Due to the relatively poor conductivity of the conventional heat conductor device, the heat does not efficiently spread out (FIG. 8a). In FIG. 8b, the heat is spread much more efficiently due to the heat conducting tiles of the heat spreader. The regular pattern of the tiles is reflected in the regular squares of essentially constant temperature giving rise to squares of constant brightness.

In the foregoing description of the figures, the invention has been described with reference to specific embodiments thereof. It will, however, be evident that various modifications and changes may be made thereto without departing from the scope of the invention as summarized in the attached claims.

The modifications and changes include, but are not limited to, the following. Other base materials that are thermally conducting and electrically insulating can be used. Other sizes and shapes of the cooling surface can be used, including a base of finned heat sinks. Other heat spreader materials can be used, including the use of inkjet printed or screen printed conductive inks, or coatings. The heatsink areas can also be put in an injection mould and the plastic injection moulded around them. The heat spreader can also be put on top of the cooling surface and pattern created by laser or other means.

In particular, combinations of specific features of various aspects of the invention may be made. An aspect of the invention may be further advantageously enhanced by adding a feature that was described in relation to another aspect of the invention.

A particularly advantageous application of the invention is in cooling devices for video processor ICs, which typically operate at high frequency. Another advantageous application is cooling of LEDs in EMI sensitive applications.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

The invention claimed is:

1. Heat conductor device for removing heat from an electrical component, the electrical component operating in a frequency range, the heat conductor device comprising:
    a body having a first thermal conductivity, the body is provided with a heat spreader comprising a pattern of thermally conducting tiles separated by gaps, the tiles having a second thermal conductivity higher than the first thermal conductivity, wherein each tile has dimensions (a,b) small enough to not act as an antenna in the frequency range, and the size of the gaps (g) is small enough to maintain the thermal conductivity and large enough to maintain electrical isolation between the tiles in the frequency range,
    wherein each tile has the dimensions (a,b) that are at most 10% of an electromagnetic wavelength corresponding to the frequency range.

2. Heat conductor device according to claim 1, wherein each tile has the dimensions (a,b) that are at most 5% of an electromagnetic wavelength corresponding to the frequency range.

3. Heat conductor device according to claim 1, wherein each tile has the dimensions (a,b) that are at most 1% of an electromagnetic wavelength corresponding to the frequency range.

4. Heat conductor device for removing heat from an electrical component, the electrical component operating in a frequency range, the heat conductor device comprising:
    a body having a first thermal conductivity, the body is provided with a heat spreader comprising a pattern of thermally conducting tiles separated by gaps, the tiles having a second thermal conductivity higher than the first thermal conductivity, wherein each tile has dimensions (a,b) small enough to not act as an antenna in the frequency range, and the size of the gaps (g) is small enough to maintain the thermal conductivity and large enough to maintain electrical isolation between the tiles in the frequency range,
    wherein the size (g) of each gap is at least 0.1% of an electromagnetic wavelength corresponding to the frequency range.

5. Heat conductor device according to claim 4, wherein the size (g) of each gap is at least 0.5% of an electromagnetic wavelength corresponding to the frequency range.

6. Heat conductor device according to claim 4, wherein the size (g) of each gap is at least 1% of an electromagnetic wavelength corresponding to the frequency range.

7. Heat conductor device according to claim 1, in which the pattern is a regular grid.

8. Heat conductor device for removing heat from an electrical component, the electrical component operating in a frequency range, the heat conductor device comprising:
    a body having a first thermal conductivity, the body is provided with a heat spreader comprising a pattern of thermally conducting tiles separated by gaps, the tiles having a second thermal conductivity higher than the first thermal conductivity, wherein each tile has dimensions (a,b) small enough to not act as an antenna in the frequency range, and the size of the gaps (g) is small enough to maintain the thermal conductivity and large enough to maintain electrical isolation between the tiles in the frequency range,
    wherein the dimensions (a,b) of each tile are between 0.5 mm and 5 mm and each gap (g) is between 0.1 mm and 1.2 mm.

9. Heat conductor device according to claim 1, in which the first heat conductivity is at most 50 W/mK and the second heat conductivity is at least 50 W/mK.

10. Heat conductor device according to claim 1, in which the tiles are made of graphite.

11. Heat conductor device according to claim 1, in which the body comprises a polymer or ceramic.

12. Film for adhering to a body of a heat conductor device, the film comprising thermally conducting tiles separated by gaps so as to form islands of heat spreader material.

13. A combination of the heat conductor device according to claim 1, with an electrical component, in thermal contact with each other.

14. The combination according to claim 13, wherein the heat spreader is adjacent to the electrical component.

* * * * *